(12) United States Patent
Kim et al.

(10) Patent No.: US 11,374,319 B2
(45) Date of Patent: Jun. 28, 2022

(54) ELECTRONIC DEVICE INCLUDING FREQUENCY-SELECTIVE CIRCUIT CONNECTED TO ANTENNA AND CONTROL METHOD THEREOF

(71) Applicant: Samsung Electronics Co., Ltd., Gyeonggi-do (KR)

(72) Inventors: Jonghyuk Kim, Gyeonggi-do (KR); Dongryul Shin, Gyeonggi-do (KR); Hyoseok Na, Gyeonggi-do (KR)

(73) Assignee: Samsung Electronics Co., Ltd

( * ) Notice: Subject to any disclaimer, the term of this patent is extended or adjusted under 35 U.S.C. 154(b) by 101 days.

(21) Appl. No.: 16/895,452

(22) Filed: Jun. 8, 2020

(65) Prior Publication Data
US 2020/0388919 A1    Dec. 10, 2020

(30) Foreign Application Priority Data

Jun. 10, 2019    (KR) .................. 10-2019-0068266

(51) Int. Cl.
*H01Q 5/30* (2015.01)
*H04B 1/48* (2006.01)
(Continued)

(52) U.S. Cl.
CPC .............. *H01Q 5/314* (2015.01); *H01Q 5/35* (2015.01); *H01Q 9/0421* (2013.01);
(Continued)

(58) Field of Classification Search
CPC ........ H01Q 5/314; H01Q 5/35; H01Q 9/0421; H01Q 15/0006; H01Q 1/44; H01Q 1/241;
(Continued)

(56) References Cited

U.S. PATENT DOCUMENTS 9,093,752 B2    7/2015   Yarga et al.
9,374,126 B2 *  6/2016   Larsen .................. H01Q 5/321
(Continued)

FOREIGN PATENT DOCUMENTS

CN    103384025    11/2013
CN    106773625    5/2017
(Continued)

OTHER PUBLICATIONS

Chinese Office Action dated Aug. 9, 2021 issued in counterpart application No. 202010516753.3, 32 pages.
(Continued)

*Primary Examiner* — Vibol Tan
(74) *Attorney, Agent, or Firm* — The Farrell Law Firm, P.C.

(57) ABSTRACT

An electronic device is provided. The electronic device may include a printed circuit board (PCB) having a ground, an antenna, a communication circuit electrically connected to the antenna through a first feeding line, a sensor module electrically connected to the antenna through a second feeding line, a first capacitor disposed on a shorting line connecting the antenna and the ground, and having a first capacitance, a second capacitor disposed on the shorting line and having a second capacitance, and a frequency-selective circuit disposed on the shorting line and selectively delivering a signal to the first capacitor or the second capacitor.

20 Claims, 14 Drawing Sheets

(51) Int. Cl.
*H03K 17/60* (2006.01)
*H01Q 5/314* (2015.01)
*H01Q 5/35* (2015.01)
*H01Q 9/04* (2006.01)
*H01Q 15/00* (2006.01)
*H03K 17/693* (2006.01)

(52) U.S. Cl.
CPC ....... *H01Q 15/0006* (2013.01); *H03K 17/693* (2013.01); *H04B 1/48* (2013.01)

(58) Field of Classification Search
CPC .......... H01Q 1/38; H01Q 1/243; H01Q 5/328; H03K 17/693; H04B 1/48; H04B 1/0064; H04B 1/0067; H04B 1/40; H04B 1/401
See application file for complete search history.

(56) References Cited

U.S. PATENT DOCUMENTS

| | | | |
|---|---|---|---|
| 9,905,908 | B2 | 2/2018 | Tang et al. |
| 10,182,505 | B2* | 1/2019 | Ochii ....................... H04B 1/38 |
| 2008/0122698 | A1 | 5/2008 | Ollikainen et al. |
| 2013/0127677 | A1 | 5/2013 | Lin et al. |
| 2013/0135153 | A1 | 5/2013 | Wang et al. |
| 2014/0087786 | A1* | 3/2014 | Tani ....................... H01Q 1/245 |
| | | | 455/556.1 |
| 2014/0253392 | A1 | 9/2014 | Yarga et al. |
| 2015/0200447 | A1 | 7/2015 | Tang et al. |
| 2016/0061983 | A1 | 3/2016 | Heikura et al. |
| 2017/0160416 | A1 | 6/2017 | Juan et al. |
| 2018/0191077 | A1 | 7/2018 | Lee et al. |
| 2018/0212313 | A1 | 7/2018 | Harper |
| 2019/0165837 | A1* | 5/2019 | Son ....................... H04B 17/14 |
| 2020/0091588 | A1 | 3/2020 | Zhao et al. |

FOREIGN PATENT DOCUMENTS

| | | |
|---|---|---|
| JP | 2016508356 A * | 3/2016 |
| KR | 1020080086767 | 9/2008 |
| KR | 1020090016494 | 2/2009 |
| KR | 1020120024908 | 3/2012 |
| KR | 1020140004363 | 1/2014 |
| KR | 10-1745612 | 6/2017 |
| WO | WO 2018/121379 | 7/2018 |

OTHER PUBLICATIONS

International Search Report dated Aug. 31, 2020 issued in counterpart application No. PCT/KR2020/007424, 9 pages.
European Search Report dated Oct. 21, 2020 issued in counterpart application No. 20179060.7-1205, 11 pages.

* cited by examiner

ELECTRONIC DEVICE INCLUDING FREQUENCY-SELECTIVE CIRCUIT CONNECTED TO ANTENNA AND CONTROL METHOD THEREOF

CROSS-REFERENCE TO RELATED APPLICATION(S)

This application is based on and claims priority under 35 U.S.C. § 119 to Korean Patent Application Serial No. 10-2019-0068266, filed on Jun. 10, 2019, in the Korean Intellectual Property Office, the entire disclosure of which is incorporated herein by reference.

BACKGROUND

1. Field

The present disclosure relates generally to an electronic device including a frequency-selective circuit connected to an antenna and a control method thereof.

2. Description of Related Art

In order to satisfy the increasing demands of radio data traffic after the commercialization of a 4G communication system, efforts have been made to develop an advanced 5G communication system or a pre-5G communication system. Also, electronic devices capable of wireless communication are being developed to support communication systems using various frequency bands.

A certain electronic device may secure antenna isolation through a capacitor connected to a shorting line of an antenna. For example, an electronic device including two or more antennas may secure isolation between the antennas through adjusted capacitance of a capacitor connected to a shorting line.

In addition, an electronic device may include an antenna capable of a multi-feeding that allows transmission and reception of signals having different frequency bands. However, this multi-feeding antenna uses a common capacitor in accordance with frequencies in a specific band, thereby suffering performance degradation.

SUMMARY

The present disclosure has been made to address at least the disadvantages described above and to provide at least the advantages described below.

In accordance with an aspect of the present disclosure, an electronic device is provided. The electronic device includes a printed circuit board (PCB) having a ground, an antenna, a communication circuit electrically connected to the antenna through a first feeding line, a sensor module electrically connected to the antenna through a second feeding line, a first capacitor disposed on a shorting line connecting the antenna and the ground, and having a first capacitance, a second capacitor disposed on the shorting line and having a second capacitance, and a frequency-selective circuit disposed on the shorting line and selectively delivering a signal to the first capacitor or the second capacitor. Other embodiments are possible.

In accordance with an aspect of the present disclosure, a method of controlling an electronic device including a frequency-selective circuit disposed on a shorting line between an antenna and a ground and selectively delivering a signal to a first capacitor or a second capacitor is provided. The method includes controlling the frequency-selective circuit to connect the antenna to the first capacitor and disconnect the antenna from the second capacitor, identifying a transmission signal size of a network radio frequency (RF) signal while the antenna is disconnected from the second capacitor, determining whether the identified transmission signal size reaches a predetermined threshold, when the identified transmission signal size reaches the predetermined threshold, controlling the frequency-selective circuit to disconnect the antenna from the first capacitor and connect the antenna to the second capacitor, and when the antenna is connected to the second capacitor, detecting a proximity or a contact of a user of the electronic device through a sensor module.

In accordance with an aspect of the present disclosure, a method of controlling an electronic device including a frequency-selective circuit disposed on a shorting line between an antenna and a ground and selectively delivering a signal to a first capacitor or a second capacitor is provided. The method includes identifying a transmission signal size of a network RF signal while the antenna is connected to the ground through the first capacitor and the second capacitor, determining whether the identified transmission signal size reaches a predetermined threshold, when the identified transmission signal size reaches the predetermined threshold, controlling the frequency-selective circuit to disconnect the antenna from the first capacitor, and when the antenna is disconnected from the first capacitor and connected to the second capacitor, detecting proximity or contact of a user of the electronic device through a sensor module.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION

Figure 1:
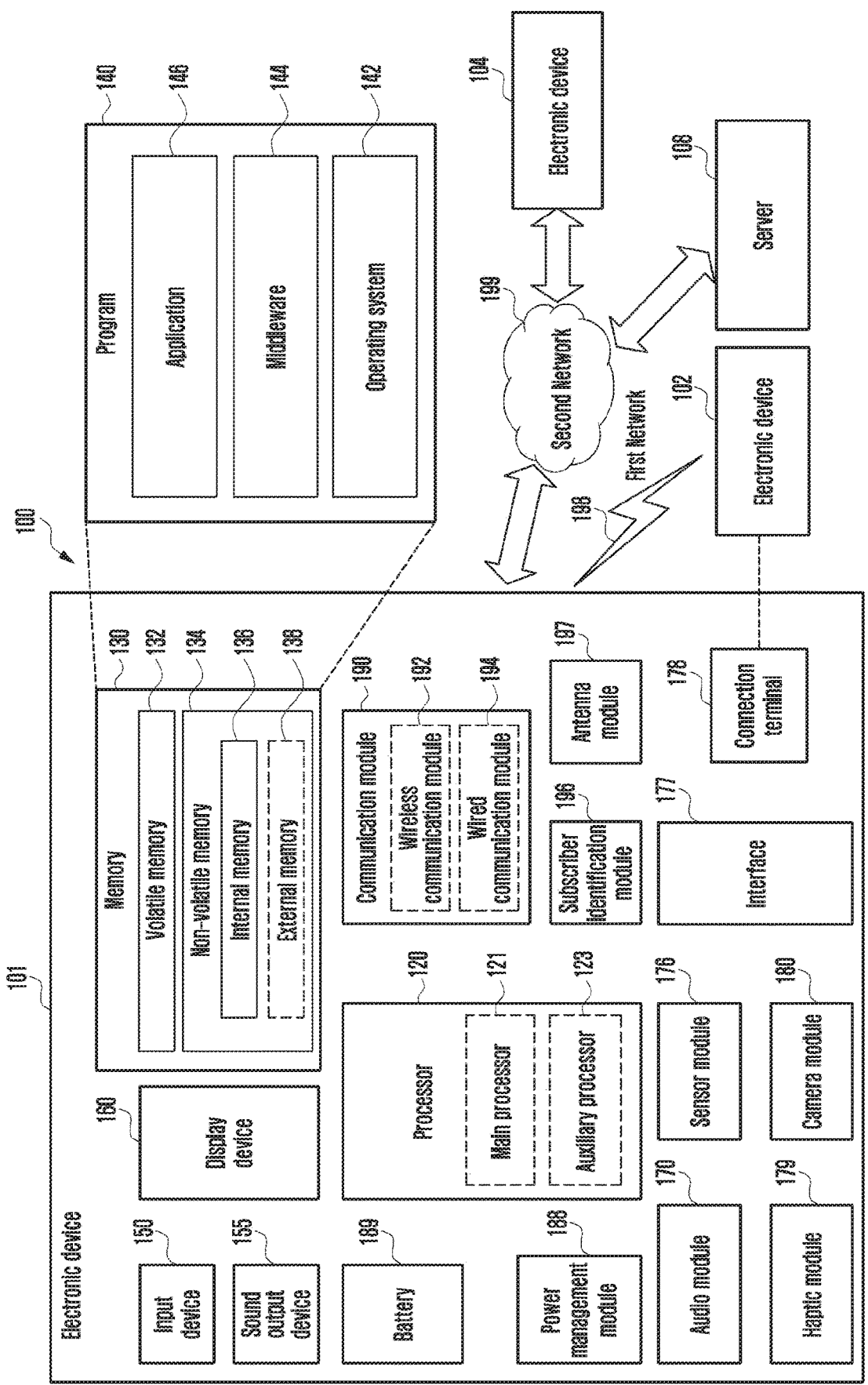
FIG. 1 is a block diagram illustrating an electronic device in a network environment, according to an embodiment.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the present disclosure. In the description of the drawings, similar reference numerals are used for similar elements.

The terms "have," "may have," "include," and "may include" as used herein indicate the presence of corresponding features (for example, elements such as numerical values, functions, operations, or parts), and do not preclude the presence of additional features.

The terms used in describing the various embodiments of the disclosure are for the purpose of describing particular embodiments and are not intended to limit the disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. Terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the disclosure.

An electronic device according to the disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

The electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment device, an electronic device for a ship (e.g., a navigation device for a ship, and a gyro-compass), avionics, security devices, an automotive head unit, a robot for home or industry, an automatic teller machine (ATM) in banks, point of sales (POS) devices in a shop, or an Internet of things (IoT) device (e.g., a light bulb, various sensors, electric or gas meter, a sprinkler device, a fire alarm, a thermostat, a streetlamp, a toaster, a sporting goods, a hot water tank, a heater, a boiler, etc.).

The electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device may be a combination of one or more of the aforementioned various devices. The electronic device may also be a flexible device. Further, the electronic device is not limited to the aforementioned devices, and may include an electronic device according to the development of new technology.

Hereinafter, an electronic device will be described with reference to the accompanying drawings. In the disclosure, the term "user" indicates a person using an electronic device or a device (e.g., an artificial intelligence electronic device) using an electronic device.

FIG. 1 is a block diagram illustrating an electronic device 101 in a network environment 100, according to an embodiment. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
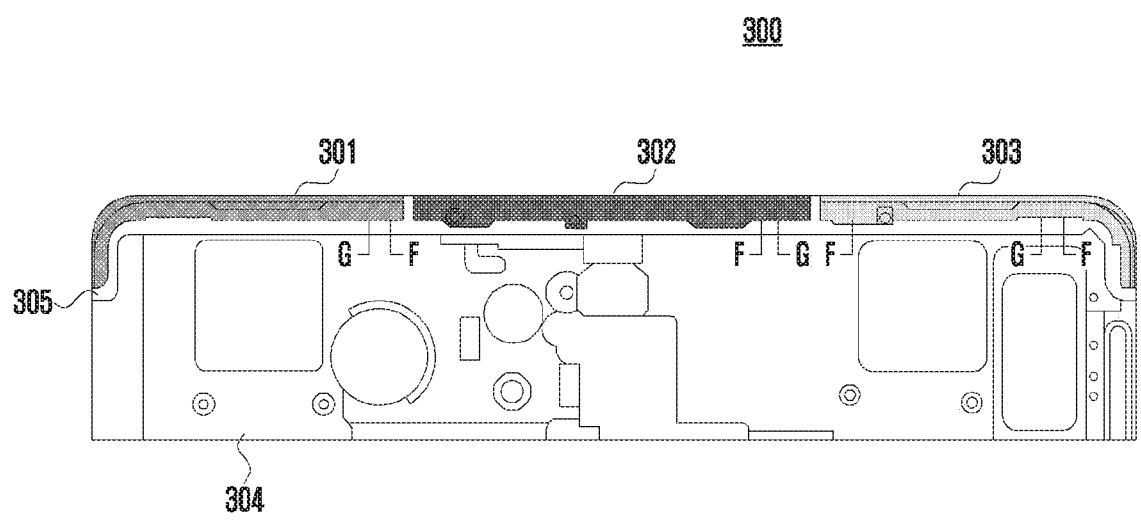
FIG. 2 is a diagram of an antenna apparatus mounted in an electronic device, according to an embodiment.

FIG. 2 is a diagram of an antenna apparatus mounted in an electronic device, according to an embodiment.

The antenna apparatus 300 may include a first antenna 301, a second antenna 302, and/or a third antenna 303.

The first antenna 301, the second antenna 302, and/or the third antenna 303 may be connected to a support portion 304 through an insert portion 305. Each of the first antenna 301, the second antenna 302, and/or the third antenna 303 may include at least one shorting line and at least one feeding line. The electronic device 101 may transmit or receive a signal or power to or from the outside (e.g., an external electronic device) through the feeding line of the antenna apparatus 300.

Each of the first antenna 301, the second antenna 302, and/or the third antenna 303 may be a planar inverted F antenna (PIFA) including at least one shorting line and at least one feeding line.

Each of the first antenna 301, the second antenna 302, and/or the third antenna 303 may be a part of a bezel of the electronic device 101.

Figure 3:
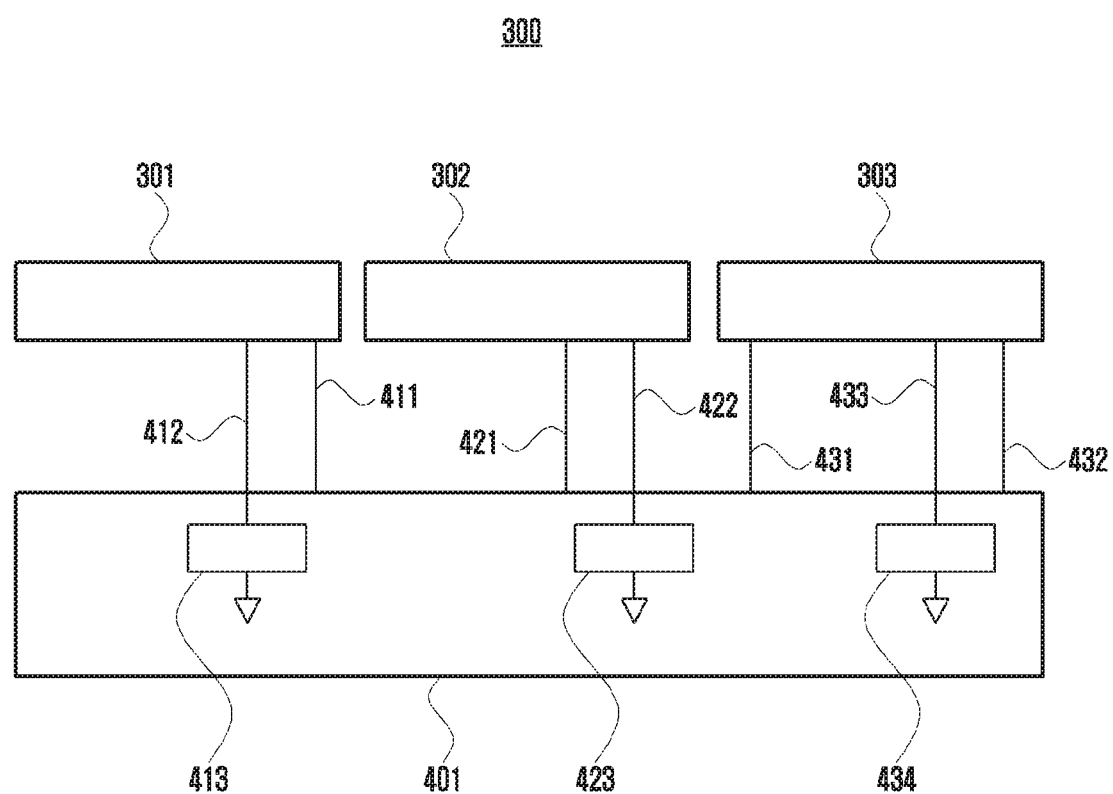
FIG. 3 is a diagram of an antenna apparatus mounted in an electronic device, according to an embodiment.

FIG. 3 is a diagram of an antenna apparatus mounted in an electronic device, according to an embodiment.

The first antenna 301 may be electrically connected to a substrate 401 (e.g., a PCB of the electronic device 101 through a first feeding line 411 or a first shorting line 412.

The second antenna 302 may be electrically connected to the substrate 401 of the electronic device 101 through a second feeding line 421 or a second shorting line 422.

The third antenna 303 may be electrically connected to the substrate 401 of the electronic device 101 through a third feeding line 431, a fourth feeding line 432, or a third shorting line 433.

The substrate 401 may include a processor (e.g., the processor 120 in FIG. 1), a CP (e.g., the auxiliary processor 123 in FIG. 1), an RFIC, a radio frequency front end (RFFE), a transceiver, a ground, and/or a sensor module (e.g., the sensor module 176 in FIG. 1).

The transceiver may be implemented in a single chip or single package. In the single chip or single package, the transceiver may be formed together with the processor, the CP, and the RFIC.

The substrate 401 may supply a signal or power to the first antenna 301, the second antenna 302, and/or the third antenna 303 through the first feeding line 411, the second feeding line 421, the third feeding line 431, and/or the fourth feeding line 432.

The third antenna 303 may perform a multi-feeding operation through the third feeding line 431 and the fourth feeding line 432.

The substrate 401 may include one or more frequency-selective circuits 413, 423, and 434 each including at least one capacitor. The frequency-selective circuits 413, 423, and 434 may connect the first antenna 301, the second antenna 302, and/or the third antenna 303 to the ground through the shorting lines 412, 422, and 433.

Figure 4:
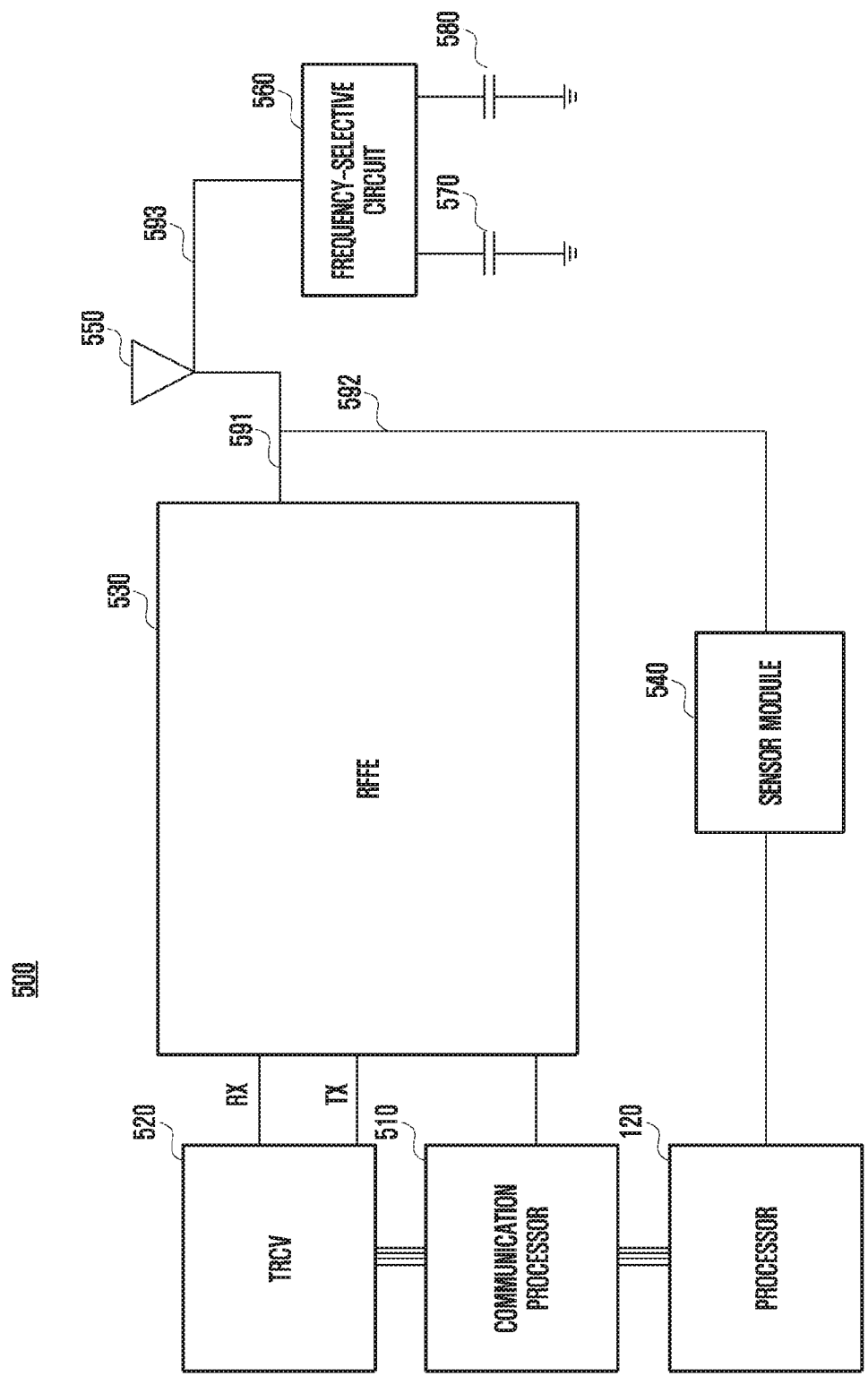
FIG. 4 is a block diagram of an antenna circuit including a frequency-selective circuit, according to an embodiment.

FIG. 4 is a block diagram of an antenna circuit including a frequency-selective circuit, according to an embodiment.

The electronic device 101 may include the antenna circuit 500 that includes the frequency-selective circuit 560.

The antenna circuit 500 may include a processor 120, a CP 510, a transceiver 520, an RFFE 530, a sensor module 540 (e.g., the sensor module 176 in FIG. 1), an antenna 550, the frequency-selective circuit 560, a first capacitor 570, and/or a second capacitor 580. The RFFE 530 may mean a communication circuit. In an embodiment, the sensor module 540 may include sensors, such as a proximity sensor or a grip sensor, capable of detecting the proximity or contact of an external object.

The electronic device 101 may communicate with at least one network (e.g., the first network 198 and/or the second network 199 in FIG. 1) through the antenna 550.

The antenna circuit 500 may not include at least one of the processor 120, the CP 510, the transceiver 520, the RFFE 530, or the sensor module 540. In an embodiment, the antenna circuit 500 may be composed of the antenna 550, feeding lines 591 and 592 connecting the antenna 550 to the RFFE 530 and/or the sensor module 540, the frequency-selective circuit 560, the first and second capacitors 570 and 580 connected between the frequency-selective circuit 560 and the ground, and a shorting line 593 connecting the frequency-selective circuit 560 and the antenna 550.

The frequency-selective circuit 560, the first capacitor 570, and the second capacitor 580 may be disposed on the shorting line 593 connecting the antenna 550 and the ground. The first capacitor 570 may be a capacitor connected, for impedance matching or isolation securing, to a short circuit of the antenna 550 corresponding to a frequency of a network RF signal fed from the RFFE 530. The second capacitor 580 may be a load capacitor, for grip, connected to a short circuit of the antenna 550 corresponding to a frequency of an RF signal fed from the sensor module 540. The grip is used to detect a human body or any surrounding object from a change of capacitance measured through the antenna based on the load capacitor. The first capacitor 570 may have a first capacitance, and the second capacitor 580 may have a second capacitance. The first capacitance of the first capacitor 570 and the second capacitance of the second capacitor 580 may be equal to or different from each other.

The processor 120 may control each of the CP 510 and the sensor module 540. Specifically, the processor 120 may control the CP 510 to transmit and receive signals to and from the network. In addition, the processor 120 may control the sensor module 540 to detect the proximity or contact of the user of the electronic device 101. The CP 510 may support establishment of a communication channel in a band to be used for radio communication with the network, and network communication through the established communication channel.

The transceiver 520 may convert, during signal transmission, a baseband signal generated by the CP 510 into an RF signal to be used in the network. In addition, during signal reception, the transceiver 520 may acquire an RF signal from the network through the antenna 550. The RF signal acquired through the antenna 550 may be preprocessed through the RFFE 530. The transceiver 520 may convert the preprocessed RF signal into a baseband signal to be processed by the CP 510.

The RFFE 530 may detect a network RF signal received from the antenna 550, amplify or modulate the detected signal, and then deliver the amplified or modulated signal to the transceiver 520. In addition, the RFFE 530 may receive a network RF signal from the transceiver 520, amplify or modulate the received signal, and then deliver the amplified or modulated signal to the antenna 550.

The sensor module 540 may detect, under the control of the processor 120, an electrical signal from the antenna 550 that may be in close proximity to or in contact with the user of the electronic device 101. The sensor module 540 may transmit detection information of the antenna 550 to the CP 510 for transmission of the RF signal or power under the control of the processor 120.

The antenna 550 may be electrically connected to the RFFE 530 and the sensor module 540. The antenna 550 may be electrically connected to the RFFE 530 through the first feeding line 591 and may also be electrically connected to the sensor module 540 through the second feeding line 592. In addition, the antenna 550 may be connected to the ground through the shorting line 593. The antenna 550 may be connected to the ground through the frequency-selective circuit 560 and one of the first and second capacitors 570 and 580.

When a network RF signal is fed from the RFFE 530 to the antenna 550, the first capacitor 570 may have a first capacitance corresponding to a frequency of the network RF signal. In addition, when a sensor RF signal is fed from the sensor module 540 to the antenna 550, the second capacitor 580 may have a second capacitance corresponding to a frequency of the sensor RF signal.

When the network RF signal is fed from the RFFE 530 to the antenna 550, the frequency of the network RF signal may range from about 600 MHz to about 5 GHz. In addition, when the sensor RF signal is fed from the sensor module 540 to the antenna 550, the frequency of the sensor RF signal may range from about 350 KHz to about 450 KHz (e.g., 400 KHz).

The frequency-selective circuit 560 may include at least one diplexer. The frequency-selective circuit 560 may include a diplexer capable of selectively transmitting a signal corresponding to a network RF signal frequency band or a sensor RF signal frequency band to the first capacitor 570 or the second capacitor 580.

The frequency-selective circuit 560 may include at least one frequency filter. The frequency-selective circuit 560 may include a filter capable of selectively transmitting a signal corresponding to a network RF signal frequency band or a sensor RF signal frequency band to the first capacitor 570 or the second capacitor 580.

The frequency-selective circuit 560 may include at least one frequency extractor. The frequency-selective circuit 560 may include an extractor capable of selectively transmitting a signal corresponding to a network RF signal frequency band or a sensor RF signal frequency band to the first capacitor 570 or the second capacitor 580.

The frequency-selective circuit 560 may include a band pass filter (BPF) or a high pass filter (HPF) at a portion connected to the first capacitor 570. In addition, the frequency-selective circuit 560 may include a low pass filter (LPF) at a portion connected to the second capacitor 580.

In the frequency-selective circuit 560, a pass band of the BPF connected to the first capacitor 570 may include the network RF signal frequency band. Also, in the frequency-selective circuit 560, a cutoff band of the HPF connected to the first capacitor 570 may be lower than the network RF signal frequency band.

In the frequency-selective circuit 560, a cutoff band of the LPF connected to the second capacitor 580 may include the network RF signal frequency band. Also, in the frequency-selective circuit 560, the cutoff band of the LPF connected to the second capacitor 580 may be higher than the sensor RF signal frequency band.

Figure 5:
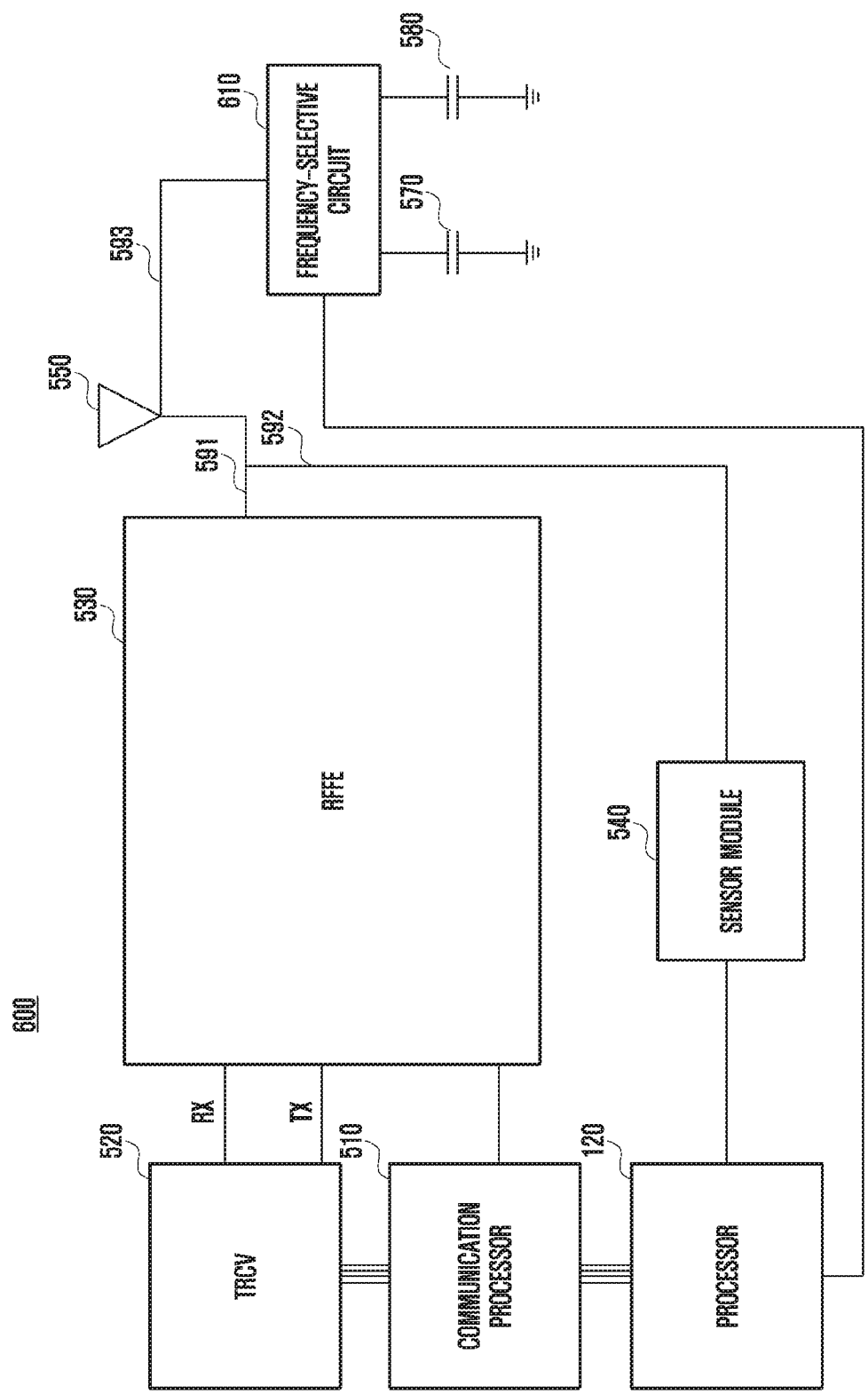
FIG. 5 is a block diagram of an antenna circuit including a frequency-selective circuit, according to an embodiment.

FIG. 5 is a block diagram of an antenna circuit including a frequency-selective circuit, according to an embodiment.

Compared to the antenna circuit 500 including the frequency-selective circuit 560 shown in FIG. 4, the antenna circuit 600 including the frequency-selective circuit 610 shown in FIG. 5 is characterized in that the frequency-selective circuit 610 may include a switch subjected to the control of the processor 120.

The antenna 550 may be connected to the frequency-selective circuit 610 through the shorting line 593 and may also be connected to the ground through the first or second capacitor 570 or 580 connected to the frequency-selective circuit 560.

The antenna 550 may be selectively connected to the ground through the first or second capacitor 570 or 580 by the frequency-selective circuit 610. Under the control of the processor 120, the frequency-selective circuit 610 may connect the antenna 550 to the first capacitor 570 corresponding to a signal of the network RF signal frequency band, and may also disconnect the antenna 550 from the second capacitor 580 corresponding to a signal of the sensor RF signal frequency band.

While the frequency-selective circuit 610 connects the antenna 550 to the first capacitor 570 and disconnects the antenna 550 from the second capacitor 580, the processor 120 may identify a transmission signal size (or feeding signal size) of the network RF signal frequency band from the CP 510.

While the frequency-selective circuit 610 connects the antenna 550 to the first capacitor 570 and disconnects the antenna 550 from the second capacitor 580, the processor 120 may determine whether the identified transmission signal size (or feeding signal size) of the network RF signal frequency band from the CP 510 reaches a predetermined threshold.

While the frequency-selective circuit 610 connects the antenna 550 to the first capacitor 570 and disconnects the antenna 550 from the second capacitor 580, and when the processor 120 determines that the identified transmission signal size (or feeding signal size) of the network RF signal frequency band from the CP 510 does not reach the predetermined threshold, the processor 120 may control the frequency-selective circuit 610 to maintain connecting the antenna 550 to the first capacitor 570 and disconnecting the antenna 550 from the second capacitor 580.

While the frequency-selective circuit 610 connects the antenna 550 to the first capacitor 570 and disconnects the antenna 550 from the second capacitor 580, and when the processor 120 determines that the identified transmission signal size (or feeding signal size) of the network RF signal frequency band from the CP 510 reaches the predetermined threshold, the processor 120 may control the frequency-selective circuit 610 to disconnect the antenna 550 from the first capacitor 570 and connect the antenna 550 to the second capacitor 580.

When the frequency-selective circuit 610 is controlled to disconnect the antenna 550 from the first capacitor 570 and connect the antenna 550 to the second capacitor 580, the processor 120 may control the sensor module 540 to transmit or feed a signal of the sensor RF signal frequency band.

When the frequency-selective circuit 610 is controlled to disconnect the antenna 550 from the first capacitor 570 and connect the antenna 550 to the second capacitor 580, the processor 120 may detect, through the sensor module 540, the proximity or contact of the user to the electronic device 101.

The antenna 550 may be always connected to the ground through the second capacitor 580 disposed on the shorting line 593, and may also be selectively connected to the ground through the frequency-selective circuit 610 connected to the first capacitor 570.

While the antenna 550 is connected to the ground through the first and second capacitors 570 and 580, the processor 120 may identify a transmission signal size (or feeding signal size) of the network RF signal frequency band from the CP 510.

While the antenna 550 is connected to the ground through the first and second capacitors 570 and 580, the processor 120 may determine whether the identified transmission signal size (or feeding signal size) of the network RF signal frequency band from the CP 510 reaches a predetermined threshold.

While the antenna 550 is connected to the ground through the first and second capacitors 570 and 580, and when the processor 120 determines that the identified transmission signal size (or feeding signal size) of the network RF signal frequency band from the CP 510 does not reach the predetermined threshold, the processor 120 may continuously identify the transmission signal size (or feeding signal size) of the network RF signal frequency band from the CP 510.

While the antenna 550 is connected to the ground through the first and second capacitors 570 and 580, and when the processor 120 determines that the identified transmission signal size (or feeding signal size) of the network RF signal frequency band from the CP 510 reaches the predetermined threshold, the processor 120 may control the frequency-selective circuit 610 to disconnect the antenna 550 from the first capacitor 570.

When the antenna 550 is connected to the second capacitor 580 and disconnected from the first capacitor 570, the processor 120 may detect, through the sensor module 540, the proximity or contact of the user to the electronic device 101.

Figure 6:
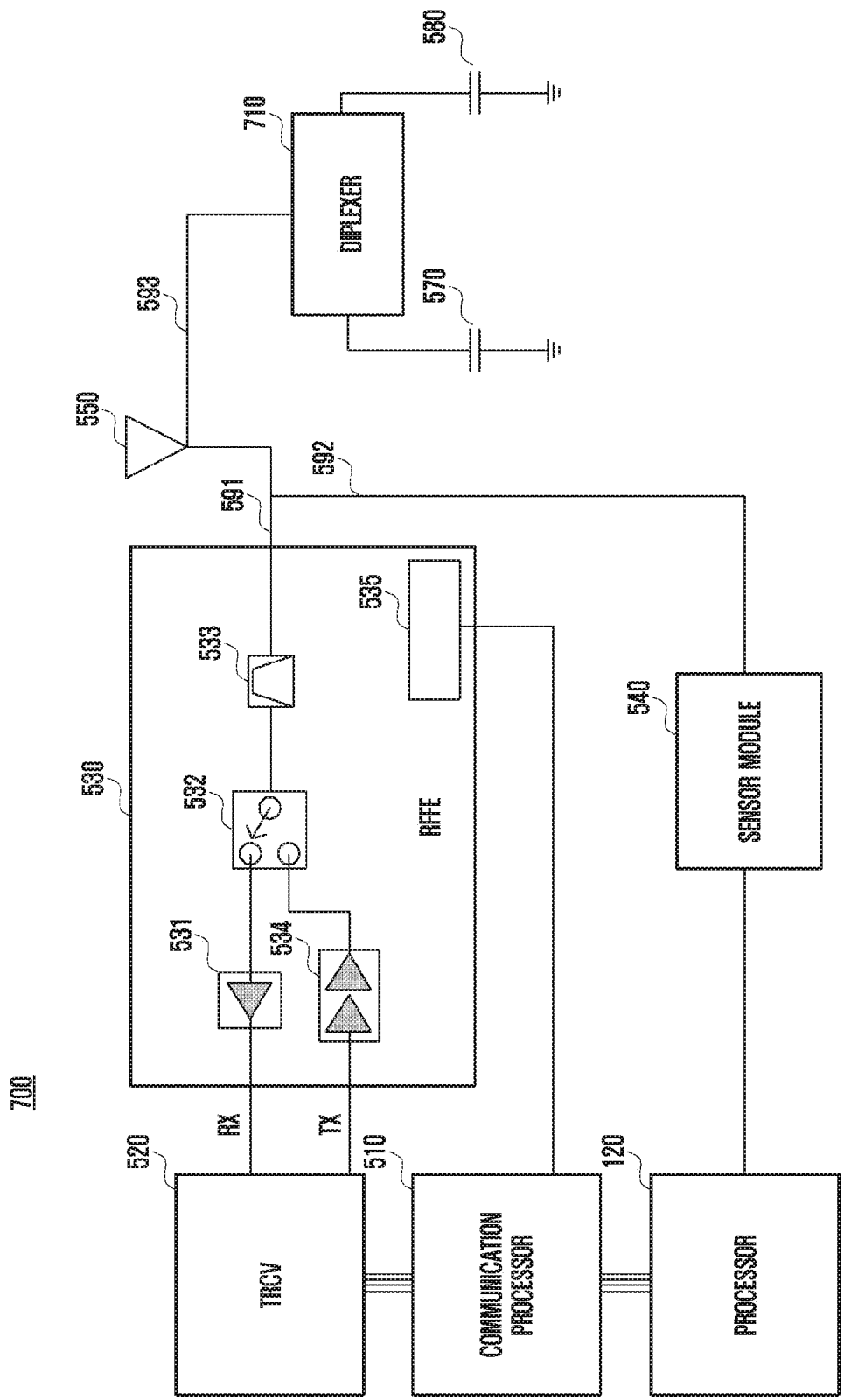
FIG. 6 is a block diagram of an antenna circuit including a diplexer, according to an embodiment.

FIG. 6 is a block diagram of an antenna circuit including a diplexer, according to an embodiment.

The antenna circuit 700 including the diplexer 710 shown in FIG. 6 corresponds to the antenna circuit 500 including the frequency-selective circuit 560 shown in FIG. 4.

The frequency-selective circuit 560 shown in FIG. 4 may include the diplexer 710 shown in FIG. 6.

The RFFE 530 shown in FIG. 6 may include circuit blocks for detecting a network RF signal received from the antenna 550, amplifying or modulating the detected signal, and then delivering the amplified or modulated signal to the transceiver 520. In addition, the circuit blocks of the RFFE 530 may receive a network RF signal from the transceiver 520, amplify or modulate the received signal, and then deliver the amplified or modulated signal to the antenna 550.

The RFFE 530 may include a reception amplifier 531 (e.g., a low-noise amplifier), a switch 532, a filter 533, a transmission amplifier 534, and/or a controller 535.

Based on a control signal received from the CP 510, the RFFE 530 may detect and amplify or modulate a network RF signal received from the antenna 550 and then transmit it to the transceiver 520, or may amplify or modulate a network RF signal received from the transceiver 520 and then transmit it to the antenna 550.

The RFFE 530 may pass a network RF signal received from the antenna 550 through the filter 533, deliver the passed signal to the switch 532, amplify or modulate the passed signal through the reception amplifier 531, and deliver the amplified or modulated signal to the transceiver 520. In addition, the RFFE 530 may receive a network RF signal from the transceiver 520, amplify or modulate the received RF signal through the transmission amplifier 534, pass the amplified or modulated signal through the switch 532 and the filter 533, and deliver the passed signal to the antenna 550.

The antenna 550 may be connected to the diplexer 710, and the diplexer 710 may be connected to the ground through the first capacitor 570 or the second capacitor 580.

The diplexer 710 may pass a signal of a network RF signal frequency band and deliver it to the first capacitor 570, or pass a signal of a sensor RF signal frequency band and deliver it to the second capacitor 580.

The diplexer 710 may deliver a signal corresponding to the network RF signal frequency band to the first capacitor 570, and deliver a signal corresponding to the sensor RF signal frequency band to the second capacitor 580.

Figure 13:
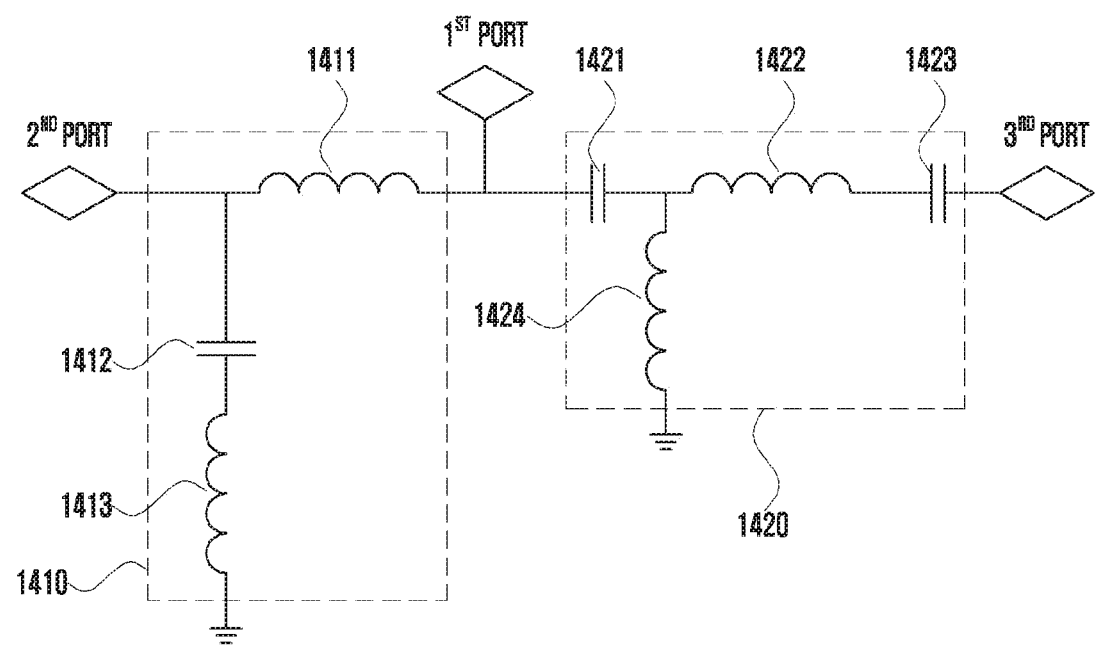
FIG. 13 is a diagram of a circuit of the diplexer of FIG. 6, according to an embodiment.

An equivalent circuit of the diplexer 710 may be as shown in FIG. 13. Referring to FIG. 13, a first port may be an antenna connection port, a second port may be a port connected to the second capacitor 580, and a third port may be a port connected to the first capacitor 570. A first pass filter 1410 (e.g., an LPF) may be disposed between the first port and the second port, and a second pass filter 1420 (e.g., a BPF or an HPF) may be disposed between the first port and the third port. The first pass filter 1410 between the first and second ports may include an inductor 1411 disposed between the first and second ports, and a capacitor 1412 and/or an inductor 1413 disposed between the second port and the ground. The second pass filter 1420 between the first and third ports may include two capacitors 1421 and 1423 and one inductor 1422 disposed between the first and third ports, and another inductor 1424 connecting a node between the capacitor 1421 and the inductor 1422 to the ground.

In the diplexer 710, a portion connected to the first capacitor 570 may be operated as a BPF or an HPF, and a portion connected to the second capacitor 580 may be operated as an LPF.

In the diplexer 710, a pass band of the BPF connected to the first capacitor 570 may include the network RF signal frequency band. Also, in the diplexer 710, a cutoff band of the HPF connected to the first capacitor 570 may be lower than the network RF signal frequency band.

In the diplexer 710, a cutoff band of the LPF connected to the second capacitor 580 may include the network RF signal frequency band. Also, in the diplexer 710, the cutoff band of the LPF connected to the second capacitor 580 may be higher than the sensor RF signal frequency band.

Figure 7:
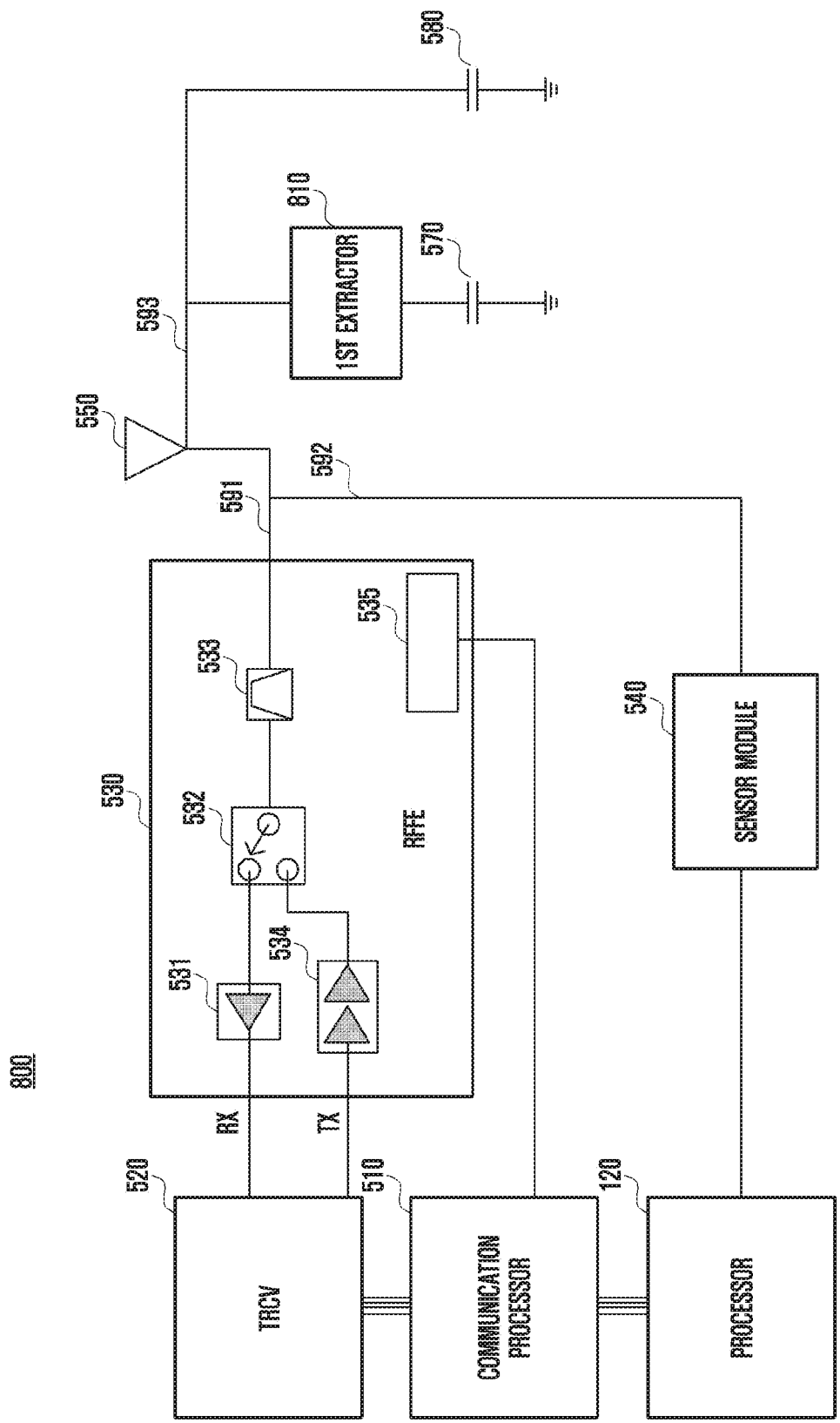
FIG. 7 is a block diagram of an antenna circuit including a first extractor, according to an embodiment.

FIG. 7 is a block diagram of an antenna circuit including a first extractor, according to an embodiment.

The antenna circuit 800 including the first extractor 810 shown in FIG. 7 corresponds to the antenna circuit 500 including the frequency-selective circuit 560 shown in FIG. 4.

The frequency-selective circuit 560 shown in FIG. 4 may include the first extractor 810 shown in FIG. 7.

The RFFE 530 shown in FIG. 7 may have the substantially same configuration as that of the RFFE 530 shown in FIG. 6.

The antenna 550 may be connected to the ground through the first capacitor 570 connected to the first extractor 810, or may be connected to the ground through the second capacitor 580 connected in parallel to the first extractor 810.

The first extractor 810 may be connected to the first capacitor 570 and include a BPF or an HPF.

In the first extractor 810, a pass band of the BPF connected to the first capacitor 570 may include the network RF signal frequency band. Also, in the first extractor 810, a cutoff band of the HPF connected to the first capacitor 570 may be lower than the network RF signal frequency band.

Figure 8:
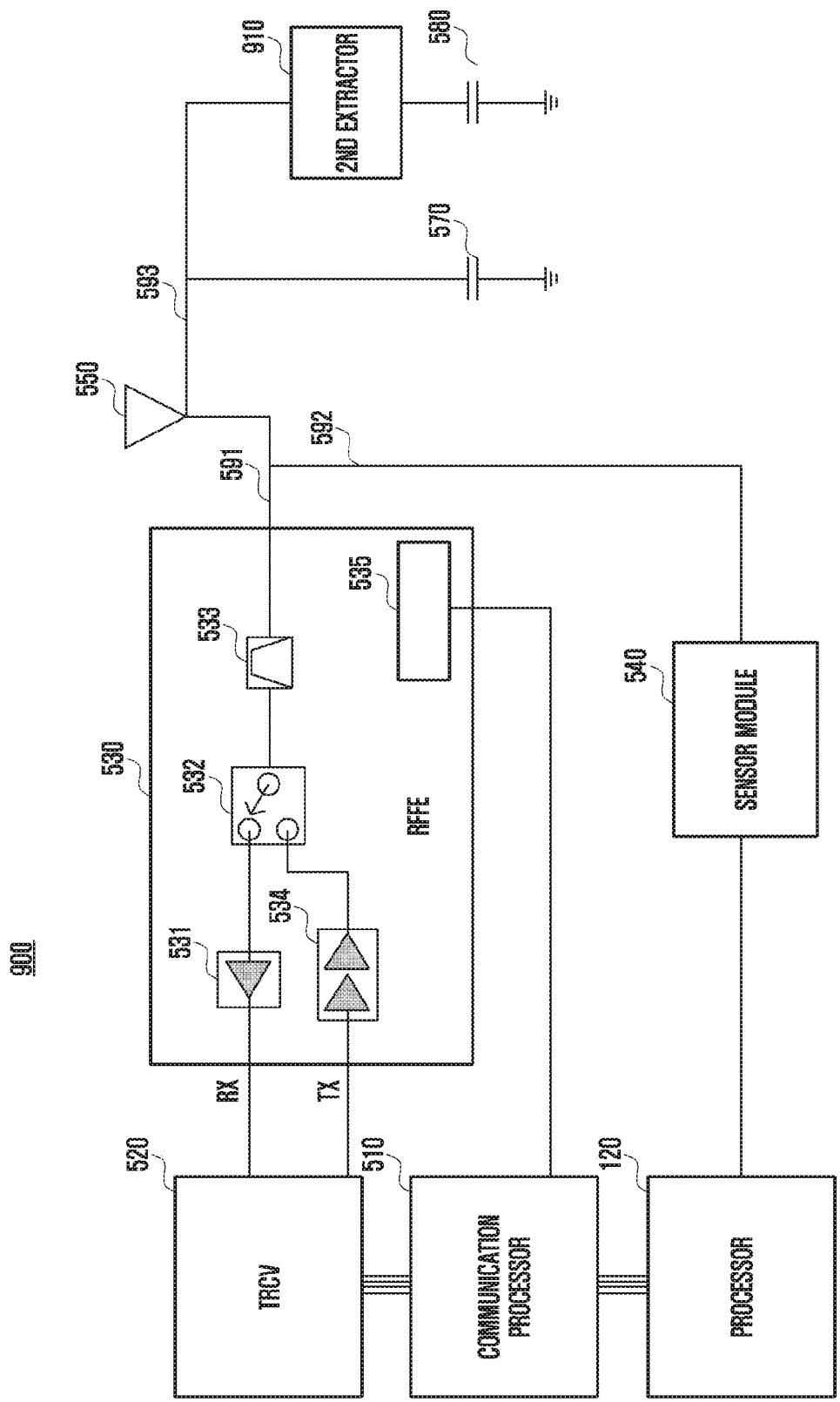
FIG. 8 is a block diagram of an antenna circuit including a second extractor, according to an embodiment.

FIG. 8 is a block diagram of an antenna circuit including a second extractor, according to an embodiment.

The antenna circuit 900 including the second extractor 910 shown in FIG. 8 corresponds to the antenna circuit 500 including the frequency-selective circuit 560 shown in FIG. 4.

The frequency-selective circuit 560 shown in FIG. 4 may include the second extractor 910 shown in FIG. 8.

The RFFE 530 shown in FIG. 8 may have the substantially same configuration as that of the RFFE 530 shown in FIG. 6.

The antenna 550 may be connected to the ground through the second capacitor 580 connected to the second extractor 910, or may be connected to the ground through the first capacitor 570 connected in parallel to the second extractor 910.

The second extractor 910 may be connected to the second capacitor 580 and include an LPF or a BPF.

In the second extractor 910, a cutoff band of the LPF or the BPF connected to the second capacitor 580 may include the network RF signal frequency band. Also, in the second extractor 910, the cutoff band of the LPF or the BPF connected to the second capacitor 580 may be higher than the sensor RF signal frequency band.

Figure 9:
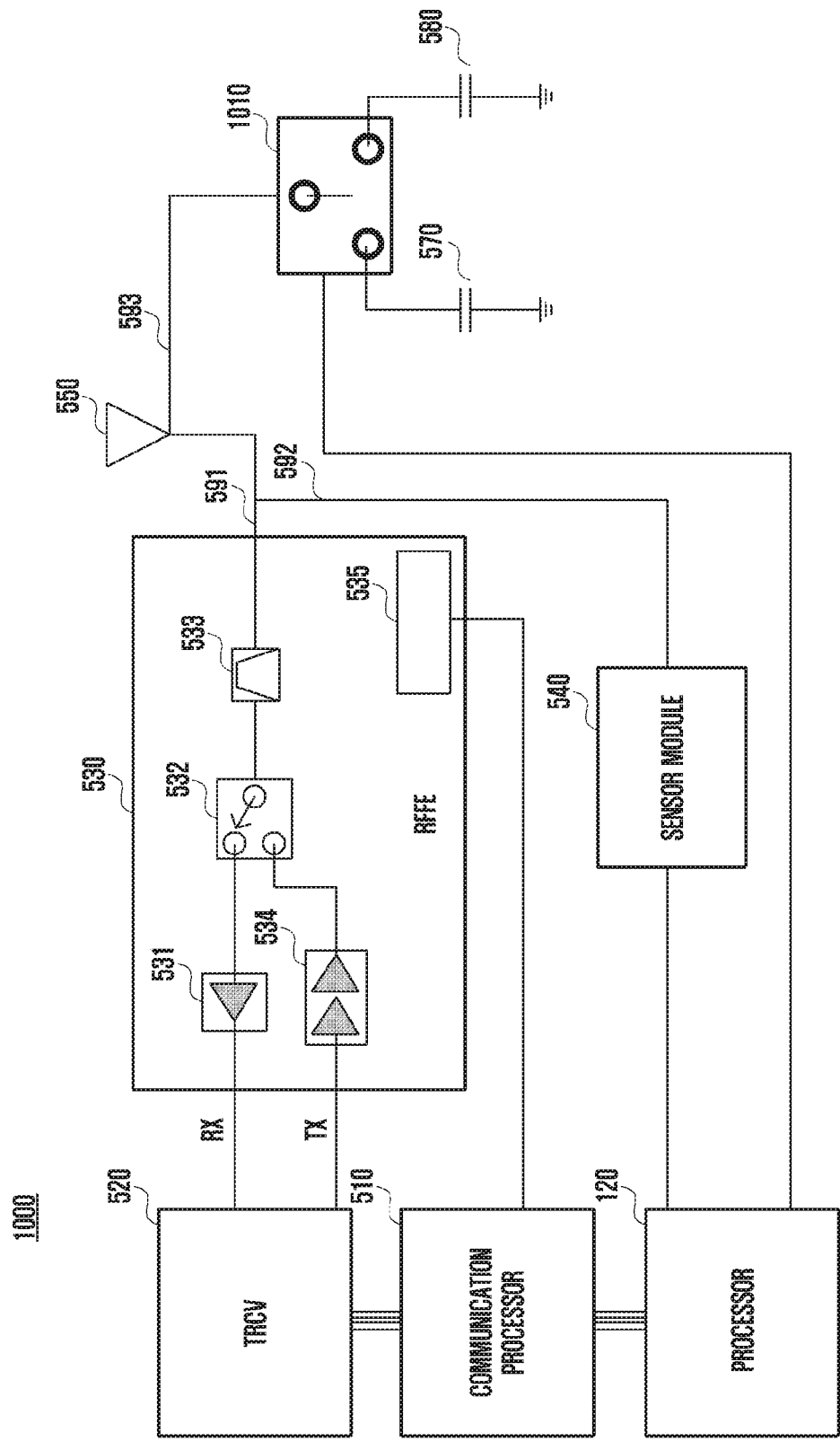
FIG. 9 is a block diagram of an antenna circuit including a single pole double throw (SPDT) switch, according to an embodiment.

FIG. 9 is a block diagram of an antenna circuit including an SPDT switch, according to an embodiment.

The antenna circuit 1000 including the SPDT switch 1010 shown in FIG. 9 corresponds to the antenna circuit 600 including the frequency-selective circuit 610 shown in FIG. 5.

The frequency-selective circuit 610 shown in FIG. 5 may include the SPDT switch 1010 shown in FIG. 9.

The RFFE 530 shown in FIG. 9 may have the substantially same configuration as that of the RFFE 530 shown in FIG. 6.

The antenna 550 may be connected to the SPDT switch 1010 and also connected to the ground through the first capacitor 570 or the second capacitor 580 connected to the SPDT switch 1010.

Under the control of the processor 120, the SPDT switch 1010 may connect the antenna 550 to the first capacitor 570 corresponding to a signal of the network RF signal frequency band, and may also disconnect the antenna 550 from the second capacitor 580 corresponding to a signal of the sensor RF signal frequency band.

While the SPDT switch 1010 connects the antenna 550 to the first capacitor 570 and disconnects the antenna 550 from the second capacitor 580, the processor 120 may identify a transmission signal size (or feeding signal size) of the network RF signal frequency band from the CP 510.

While the SPDT switch 1010 connects the antenna 550 to the first capacitor 570 and disconnects the antenna 550 from the second capacitor 580, the processor 120 may determine whether the identified transmission signal size (or feeding signal size) of the network RF signal frequency band from the CP 510 reaches a predetermined threshold. The predetermined threshold may be a specific absorption rate (SAR) defined in international standards. That is, a signal size corresponding to the SAR may be determined as the predetermined threshold.

While the SPDT switch 1010 connects the antenna 550 to the first capacitor 570 and disconnects the antenna 550 from the second capacitor 580, and when the processor 120 determines that the identified transmission signal size (or feeding signal size) of the network RF signal frequency band from the CP 510 does not reach the predetermined threshold, the processor 120 may control the SPDT switch 1010 to maintain connecting the antenna 550 to the first capacitor 570 and disconnecting the antenna 550 from the second capacitor 580.

While the SPDT switch 1010 connects the antenna 550 to the first capacitor 570 and disconnects the antenna 550 from the second capacitor 580, and when the processor 120 determines that the identified transmission signal size (or feeding signal size) of the network RF signal frequency band from the CP 510 reaches the predetermined threshold, the processor 120 may control the SPDT switch 1010 to disconnect the antenna 550 from the first capacitor 570 and connect the antenna 550 to the second capacitor 580.

When the SPDT switch 1010 is controlled to disconnect the antenna 550 from the first capacitor 570 and connect the antenna 550 to the second capacitor 580, the processor 120 may control the sensor module 540 to transmit or feed a signal of the sensor RF signal frequency band.

When the SPDT switch 1010 is controlled to disconnect the antenna 550 from the first capacitor 570 and connect the antenna 550 to the second capacitor 580, the processor 120 may detect, through the sensor module 540, the proximity of the user to, or contact by the user of, the electronic device 101.

Figure 10:
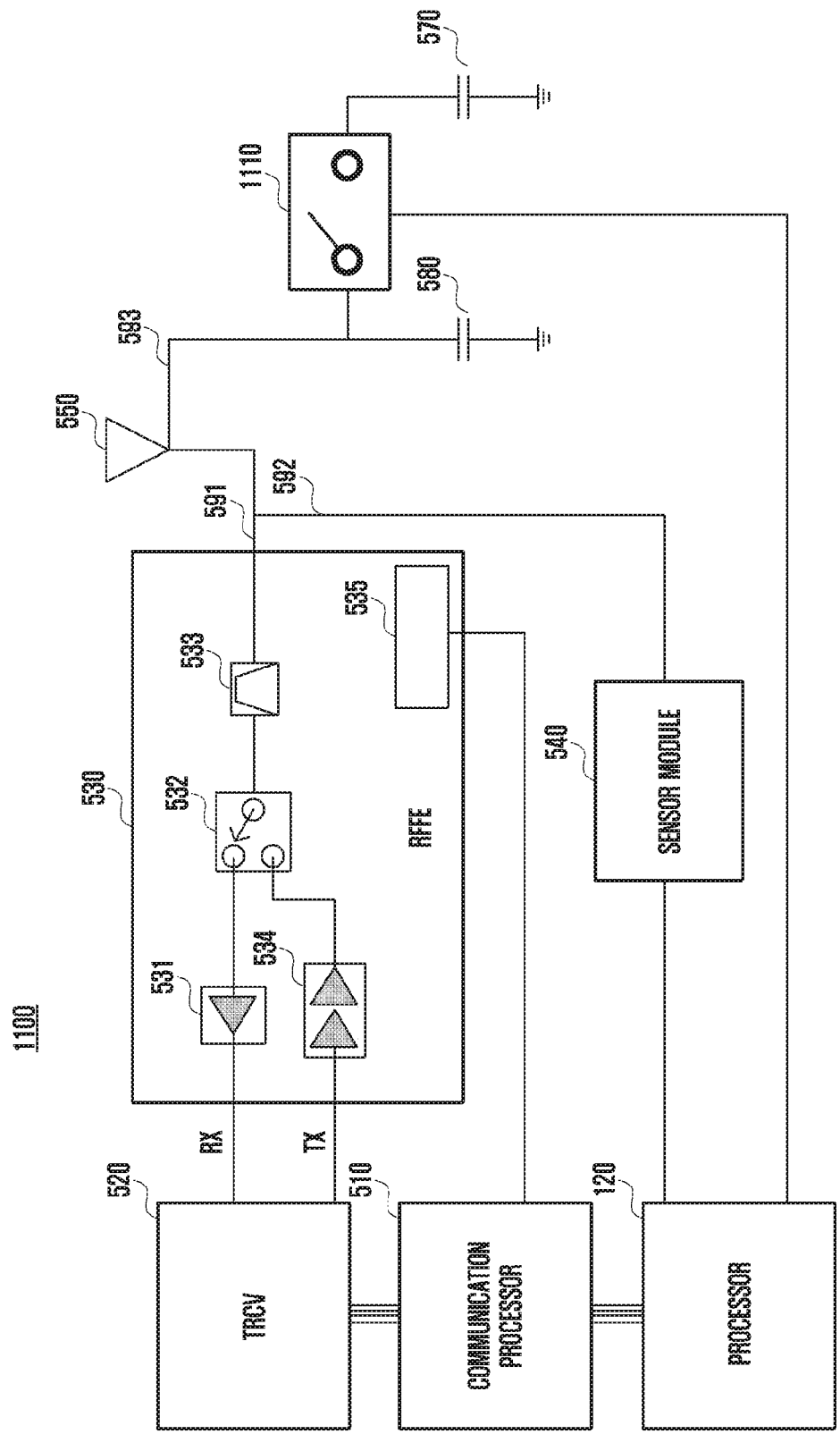
FIG. 10 is a block diagram of an antenna circuit including a single pole single throw (SPST) switch, according to an embodiment.

FIG. 10 is a block diagram of an antenna circuit including an SPST switch, according to an embodiment.

The antenna circuit 1000 including the SPST switch 1110 shown in FIG. 10 corresponds to the antenna circuit 600 including the frequency-selective circuit 610 shown in FIG. 5.

The frequency-selective circuit 610 shown in FIG. 5 may include the SPST switch 1110 shown in FIG. 10.

The RFFE 530 shown in FIG. 10 may have the substantially same configuration as that of the RFFE 530 shown in FIG. 9.

The antenna 550 may be connected to the ground through the first capacitor 570 connected to the SPST switch 1110 while being connected to the ground through the second capacitor 580 on the shorting line 593.

While the antenna 550 is connected to the ground through the second capacitor 580 on the shorting line 593, the electronic device 101 may increase capacitance by operating the SPST switch 1110 to be connected to the first capacitor 570. A first capacitance of the first capacitor 570 may be determined to correspond to a network RF signal, based on a second capacitance of the second capacitor 580.

While the antenna 550 is connected to the ground through the first and second capacitors 570 and 580, the processor 120 may identify a transmission signal size (or feeding signal size) of the network RF signal frequency band from the CP 510.

While the antenna 550 is connected to the ground through the first and second capacitors 570 and 580, the processor 120 may determine whether the identified transmission signal size (or feeding signal size) of the network RF signal frequency band from the CP 510 reaches a predetermined threshold. The predetermined threshold may be an SAR defined in international standards. That is, a signal size corresponding to the SAR may be determined as the predetermined threshold.

While the antenna 550 is connected to the ground through the first and second capacitors 570 and 580, and when the processor 120 determines that the identified transmission signal size (or feeding signal size) of the network RF signal frequency band from the CP 510 does not reach the predetermined threshold, the processor 120 may continuously identify the transmission signal size (or feeding signal size) of the network RF signal frequency band from the CP 510.

While the antenna 550 is connected to the ground through the first and second capacitors 570 and 580, and when the processor 120 determines that the identified transmission signal size (or feeding signal size) of the network RF signal frequency band from the CP 510 reaches the predetermined threshold, the processor 120 may control the SPST switch 1110 to disconnect the antenna 550 from the first capacitor 570 and thereby connect the antenna 550 to the second capacitor 580 only.

When the antenna 550 is connected to the second capacitor 580 and disconnected from the first capacitor 570, the processor 120 may detect, through the sensor module 540, the proximity or contact of the user to the electronic device 101.

Figure 11:
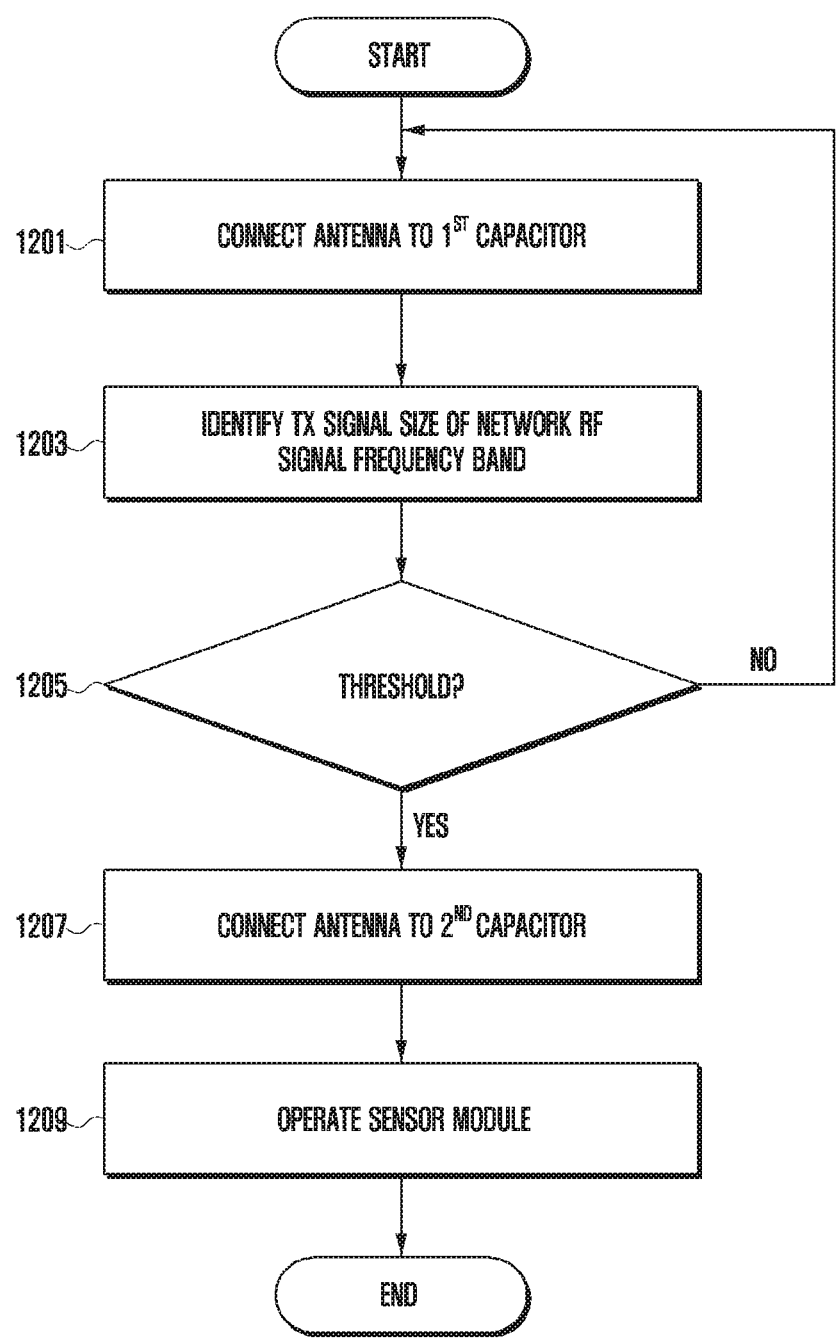
FIG. 11 is a flowchart of an operation of an antenna circuit including an SPDT switch, according to an embodiment.

FIG. 11 is a flowchart of an operation of an antenna circuit including an SPDT switch, according to an embodiment.

At step 1201, under the control of the processor 120, the SPDT switch 1010 may connect the antenna 550 to the first capacitor 570 corresponding to a signal of the network RF signal frequency band, and may also disconnect the antenna 550 from the second capacitor 580 corresponding to a signal of the sensor RF signal frequency band.

At step 1203, the processor 120 may identify a transmission signal size (or feeding signal size) of the network RF signal frequency band from the CP 510.

At step 1205, the processor 120 may determine whether the identified transmission signal size (or feeding signal size) of the network RF signal frequency band from the CP 510 reaches a predetermined threshold.

When the processor 120 determines at step 1205 that the identified transmission signal size (or feeding signal size) of the network RF signal frequency band from the CP 510 does not reach the predetermined threshold, the processor 120 may return to step 1201.

When the processor 120 determines at step 1205 that the identified transmission signal size (or feeding signal size) of the network RF signal frequency band from the CP 510 reaches the predetermined threshold, the processor 120 may perform step 1207. The predetermined threshold may be an SAR defined in international standards. That is, a signal size corresponding to the SAR may be determined as the predetermined threshold.

At step 1207, the processor 120 may control the SPDT switch 1010 to disconnect the antenna 550 from the first capacitor 570 and connect the antenna 550 to the second capacitor 580.

At step 1209, the processor 120 may control the sensor module 540 to transmit or feed a signal of the sensor RF signal frequency band. Through the sensor module 540, the processor 120 may detect the proximity or contact of the user to the electronic device 101.

Figure 12:
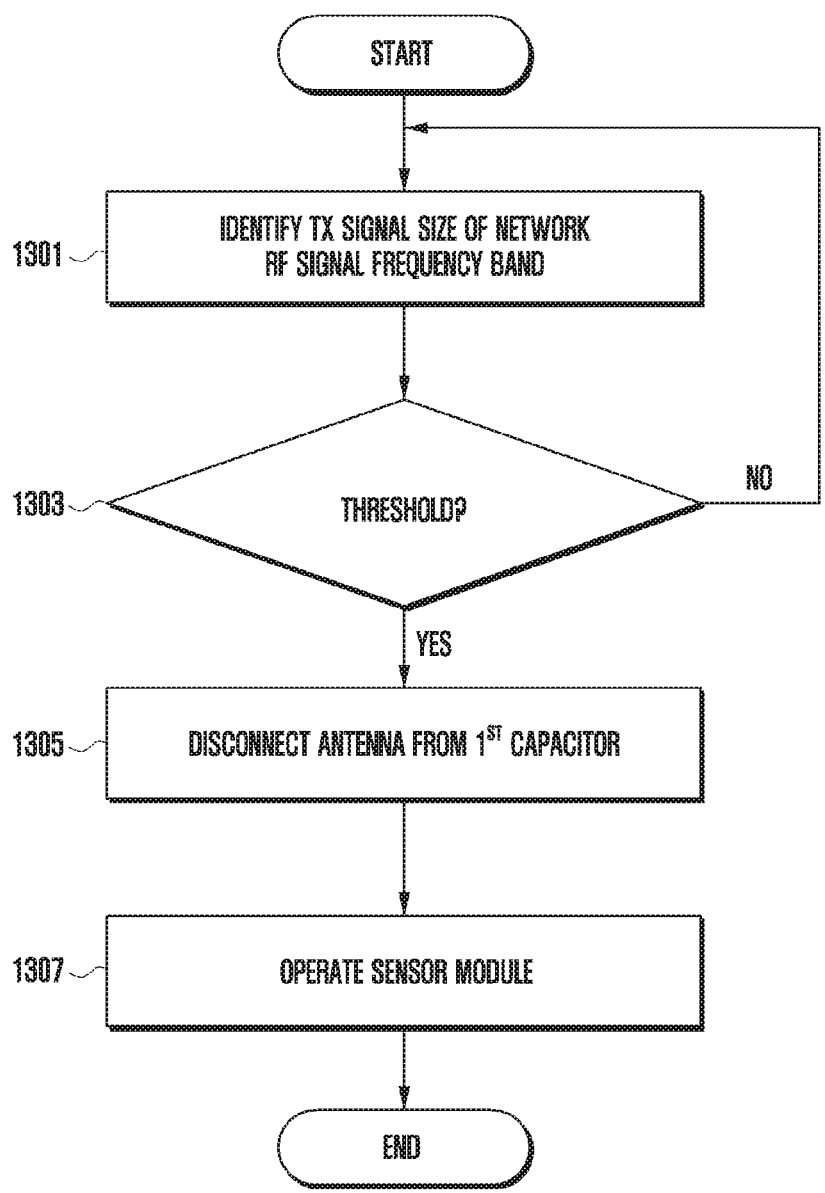
FIG. 12 is a flowchart of an operation of an antenna circuit including an SPST switch, according to an embodiment.

FIG. 12 is a flowchart of an operation of an antenna circuit including an SPST switch, according to an embodiment.

At step 1301, while the antenna 550 is connected to the ground through the first and second capacitors 570 and 580, the processor 120 may identify a transmission signal size (or feeding signal size) of the network RF signal frequency band from the CP 510.

At step 1303, the processor 120 may determine whether the identified transmission signal size of the network RF signal frequency band from the CP 510 reaches a predetermined threshold.

When the processor 120 determines at step 1303 that the identified transmission signal size of the network RF signal frequency band from the CP 510 does not reach the predetermined threshold, the processor 120 may return to step 1301. The predetermined threshold may be an SAR defined in international standards. That is, a signal size corresponding to the SAR may be determined as the predetermined threshold.

When the processor 120 determines at step 1303 that the identified transmission signal size of the network RF signal frequency band from the CP 510 reaches the predetermined threshold, the processor 120 may perform step 1305.

At step 1305, the processor 120 may control the SPST switch 1110 to disconnect the antenna 550 from the first capacitor 570.

When the antenna 550 is connected to the second capacitor 580 and disconnected from the first capacitor 570, the processor 120 may detect at step 1307 the proximity or contact of the user to the electronic device 101 through the sensor module 540.

FIG. 13 is a diagram of a circuit of the diplexer of FIG. 6, according to an embodiment.

Referring to FIG. 13, a first port may be an antenna connection port, a second port may be a port connected to the second capacitor 580, and a third port may be a port connected to the first capacitor 570. An LPF 1410 may be disposed between the first port and the second port, and a BPF 1420 or an HPF 1420 may be disposed between the first port and the third port. The LPF 1410 between the first and second ports may include an inductor 1411 disposed between the first and second ports, and a capacitor 1412 and an inductor 1413 disposed between the second port and the ground. The BPF 1420 or the HPF 1420 between the first and third ports may include two capacitors 1421 and 1423 and one inductor 1422 disposed between the first and third ports, and another inductor 1424 connecting a node between the capacitor 1421 and the inductor 1422 to the ground.

In the diplexer 710, a portion connected to the first capacitor 570 may be operated as a BPF or an HPF, and a portion connected to the second capacitor 580 may be operated as an LPF.

In the diplexer 710, a pass band of the BPF connected to the first capacitor 570 may include the network RF signal frequency band. Also, in the diplexer 710, a cutoff band of the HPF connected to the first capacitor 570 may be lower than the network RF signal frequency band.

In the diplexer 710, a cutoff band of the LPF connected to the second capacitor 580 may include the network RF signal frequency band. Also, in the diplexer 710, the cutoff band of the LPF connected to the second capacitor 580 may be higher than the sensor RF signal frequency band.

Figure 14:
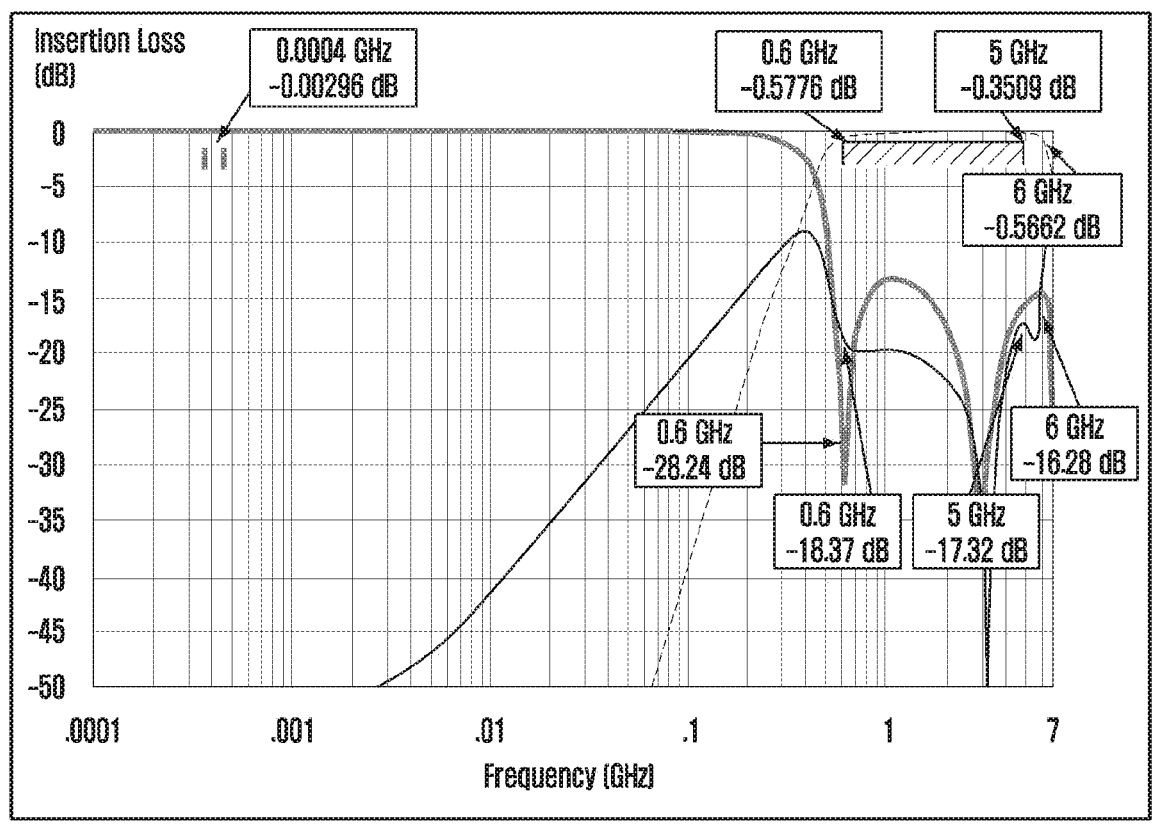
FIG. 14 is a diagram of the performance of the antenna circuit using the diplexer of FIG. 6, according to an embodiment.

FIG. 14 is a diagram of the performance of the antenna circuit using the diplexer of FIG. 6, according to an embodiment.

Referring to FIGS. 6, 13, and 14, at S21 from the first port to the second port (i.e., output from the antenna to the second capacitor), the diplexer 710 may have the characteristics of an LPF that has an insertion loss of about 0.003 dB at 400 KHz and forms a cutoff band at about 100 MHz. In addition, at S31 from the first port to the third port (i.e., output from the antenna to the first capacitor), the diplexer 710 may have the characteristics of an HPF having −0.5776 dB at 600 MHz and −0.3509 dB at 5 GHz.

According to an embodiment, an electronic device may include a PCB including a ground, an antenna, a communication circuit electrically connected to the antenna through a first feeding line, a sensor module electrically connected to the antenna through a second feeding line, a first capacitor disposed on a shorting line connecting the antenna and the ground, and having a first capacitance, a second capacitor disposed on the shorting line and having a second capacitance, and a frequency-selective circuit or disposed on the shorting line and selectively delivering a signal to the first capacitor or the second capacitor.

The communication circuit may transmit a network RF signal having a first frequency band through the first feeding line, and the sensor module 540 may transmit a sensor signal having a second frequency band through the second feeding line.

The first frequency band may range from about 600 MHz to about 5 GHz, and the second frequency band may range from about 350 KHz to about 450 KHz.

The frequency-selective circuit may include a diplexer including a first port electrically connected to the antenna, a second port connected to the first capacitor, and a third port connected to the second capacitor.

The diplexer may transmit the network RF signal to the first capacitor and transmit the sensor RF signal to the second capacitor.

The diplexer may include a portion connecting the antenna to the first capacitor and operating as an HPF or a BPF, and another portion connecting the antenna to the second capacitor and operating as an LPF.

The frequency-selective circuit may include a first extractor, the first extractor may be disposed between the first capacitor and the antenna, and the second capacitor may be disposed between the antenna and the ground.

The first extractor may transmit the network RF signal to the first capacitor.

The frequency-selective circuit may include a second extractor, the second extractor may be disposed between the second capacitor and the antenna, and the first capacitor may be disposed between the antenna and the ground.

The second extractor may transmit the sensor RF signal to the second capacitor.

The electronic device may further include a processor that may control the frequency-selective circuit to connect the antenna to the first capacitor or the second capacitor.

The frequency-selective circuit may include an SPDT switch 1010.

The frequency-selective circuit may include an SPST switch 1110.

The processor may be configured to control the SPDT switch to connect the antenna to the first capacitor and disconnect the antenna from the second capacitor, to identify a transmission signal size of the network RF signal while the antenna is disconnected from the second capacitor, determine whether the identified transmission signal size reaches a predetermined threshold, when the identified transmission signal size reaches the predetermined threshold, control the SPDT switch to disconnect the antenna from the first capacitor and connect the antenna to the second capacitor, and when the antenna is connected to the second capacitor, detect proximity or contact of a user of the electronic device through the sensor module.

The processor may be configured to identify a transmission signal size of the network RF signal while the antenna is connected to the ground through the first capacitor and the second capacitor, determine whether the identified transmission signal size reaches a predetermined threshold, when the identified transmission signal size reaches the predetermined threshold, control the SPST switch to disconnect the antenna from the first capacitor, and when the antenna 550 is disconnected from the first capacitor and connected to the second capacitor, detect a proximity or a contact of a user of the electronic device through the sensor module.

The electronic device may further include a processor, a communication processor, and a transceiver converting a baseband signal generated by the communication processor into an RF signal to be used in the communication circuit.

According to an embodiment, a method of controlling an electronic device including a frequency-selective circuit disposed on a shorting line between an antenna and a ground and selectively delivering a signal to a first capacitor or a second capacitor may include controlling the frequency-selective circuit to connect the antenna to the first capacitor and disconnect the antenna from the second capacitor, identifying a transmission signal size of a network RF signal while the antenna is disconnected from the second capacitor, determining whether the identified transmission signal size reaches a predetermined threshold, when the identified transmission signal size reaches the predetermined threshold, controlling the frequency-selective circuit to disconnect the antenna from the first capacitor and connect the antenna to the second capacitor, and when the antenna is connected to the second capacitor, detecting a proximity or a contact of a user of the electronic device through a sensor module.

The frequency-selective circuit may include an SPDT switch 1010.

According to an embodiment, a method of controlling an electronic device including a frequency-selective circuit disposed on a shorting line between an antenna and a ground and selectively delivering a signal to a first capacitor or a second capacitor may include identifying a transmission signal size of a network RF signal while the antenna is connected to the ground through the first capacitor and the second capacitor, determining whether the identified transmission signal size reaches a predetermined threshold, when the identified transmission signal size reaches the predetermined threshold, controlling the frequency-selective circuit to disconnect the antenna from the first capacitor, and when the antenna is disconnected from the first capacitor and connected to the second capacitor, detecting a proximity or a contact of a user of the electronic device through a sensor module.

The frequency-selective circuit may include an SPST switch.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device comprising:
a printed circuit board (PCB) including a ground;
an antenna;
a communication circuit electrically connected to the antenna through a first feeding line and configured to transmit a network radio frequency (RF) signal having a first frequency band through the first feeding line;
a sensor module electrically connected to the antenna through a second feeding line and configured to transmit a sensor RF signal having a second frequency band through the second feeding line;
a first capacitor disposed on a shorting line connecting the antenna and the ground, and having a first capacitance;
a second capacitor disposed on the shorting line and having a second capacitance;
a frequency-selective circuit disposed on the shorting line and selectively delivering a signal to the first capacitor or the second capacitor; and
at least one processor configured to:
control the frequency-selective circuit to connect the antenna to at least one of the first capacitor and the second capacitor,
identify a transmission signal size of the network RF signal while the antenna is connected to the ground through at least one of the first capacitor and the second capacitor, and
determine whether the identified transmission signal size reaches a predetermined threshold.

2. The electronic device of claim 1, wherein when the identified transmission signal size reaches the predetermined threshold, disconnect the antenna from the first capacitor by controlling a switch included in the frequency-selective circuit.

3. The electronic device of claim 1, wherein the first frequency band ranges from about 600 MHz to about 5 GHz, and the second frequency band ranges from about 350 KHz to about 450 KHz.

4. The electronic device of claim 1 wherein the frequency-selective circuit includes a diplexer including a first port electrically connected to the antenna, a second port connected to the first capacitor, and a third port connected to the second capacitor.

5. The electronic device of claim 4, wherein the diplexer transmits the network RF signal to the first capacitor and transmits the sensor RF signal to the second capacitor.

6. The electronic device of claim 4, wherein the diplexer includes:
a first portion connecting the antenna to the first capacitor and operating as a high pass filter or a band pass filter, and
a second portion connecting the antenna to the second capacitor and operating as a low pass filter.

7. The electronic device of claim 1 wherein the frequency-selective circuit includes a first extractor,
wherein the first extractor is disposed between the first capacitor and the antenna, and
wherein the second capacitor is disposed between the antenna and the ground.

8. The electronic device of claim 7, wherein the first extractor transmits the network RF signal to the first capacitor.

9. The electronic device of claim 1 wherein the frequency-selective circuit includes a second extractor,
wherein the second extractor is disposed between the second capacitor and the antenna, and
wherein the first capacitor is disposed between the antenna and the ground.

10. The electronic device of claim 9, wherein the second extractor transmits the sensor RF signal to the second capacitor.

11. The electronic device of claim 1, wherein, when the antenna is disconnected from the first capacitor and connected to the second capacitor, detect a proximity or a contact of a user of the electronic device through the sensor module.

12. The electronic device of claim 2, wherein the switch in the frequency-selective circuit is a single pole double throw (SPDT) switch.

13. The electronic device of claim 12, wherein the at least one processor is further configured to:
when the identified transmission signal size reaches the predetermined threshold, control the SPDT switch to disconnect the antenna from the first capacitor and connect the antenna to the second capacitor, and
when the antenna is connected to the second capacitor, detect a proximity or a contact of a user of the electronic device through the sensor module.

14. The electronic device of claim 2, wherein the frequency-selective circuit is a single pole single throw (SPST) switch.

15. The electronic device of claim 14, wherein the at least one processor is further configured to:
when the identified transmission signal size reaches the predetermined threshold, control the SPST switch to disconnect the antenna from the first capacitor, and
when the antenna is disconnected from the first capacitor and connected to the second capacitor, detect a proximity or a contact of a user of the electronic device through the sensor module.

16. The electronic device of claim 1,
wherein the at least one processor comprises:
a communication processor; and
a transceiver converting a baseband signal generated by the communication processor into an RF signal to be used in the communication circuit.

17. A method of controlling an electronic device including a frequency-selective circuit disposed on a shorting line between an antenna and a ground and selectively delivering a signal to a first capacitor or a second capacitor, the method comprising:
controlling the frequency-selective circuit to connect the antenna to the first capacitor and disconnect the antenna from the second capacitor;
identifying a transmission signal size of a network radio frequency (RF) signal while the antenna is disconnected from the second capacitor;
determining whether the identified transmission signal size reaches a predetermined threshold;
when the identified transmission signal size reaches the predetermined threshold, controlling the frequency-selective circuit to disconnect the antenna from the first capacitor and connect the antenna to the second capacitor; and
when the antenna is connected to the second capacitor, detecting a proximity or a contact of a user of the electronic device through a sensor module.

18. The method of claim 17, wherein the frequency-selective circuit includes a single pole double throw (SPDT) switch.

19. A method of controlling an electronic device including a frequency-selective circuit disposed on a shorting line between an antenna and a ground and selectively delivering a signal to a first capacitor or a second capacitor, the method comprising:

- identifying a transmission signal size of a network radio frequency (RF) signal while the antenna is connected to the ground through the first capacitor and the second capacitor;
- determining whether the identified transmission signal size reaches a predetermined threshold;
- when the identified transmission signal size reaches the predetermined threshold, controlling the frequency-selective circuit to disconnect the antenna from the first capacitor; and
- when the antenna is disconnected from the first capacitor and connected to the second capacitor, detecting proximity or contact of a user of the electronic device through a sensor module.

20. The method of claim 19, wherein the frequency-selective circuit includes a single pole single throw (SPST) switch.

* * * * *